(12) United States Patent
Dai (10) Patent No.: US 11,088,329 B2
(45) Date of Patent: Aug. 10, 2021

(54) CARRIER SUBSTRATE AND FABRICATING METHOD THEREOF, FLEXIBLE SUBSTRATE AND FABRICATING METHOD THEREOF, AND DISPLAY DEVICE

(71) Applicant: BOE TECHNOLOGY GROUP CO., LTD., Beijing (CN)

(72) Inventor: Qing Dai, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/536,658

(22) Filed: Aug. 9, 2019

(65) Prior Publication Data

US 2020/0266347 A1 Aug. 20, 2020

(30) Foreign Application Priority Data

Feb. 20, 2019 (CN) .................. 201910125372.X (51) Int. Cl.
*H01L 51/00* (2006.01)
*H01L 27/32* (2006.01)
(Continued)

(52) U.S. Cl.
CPC .............. *H01L 51/003* (2013.01); *G03F 7/09* (2013.01); *H01L 27/3244* (2013.01);
(Continued)

(58) Field of Classification Search
CPC ............... H01L 51/003; H01L 27/3244; H01L 51/0097; H01L 51/56; H01L 2227/326;
(Continued)

(56) References Cited

U.S. PATENT DOCUMENTS

2005/0274454 A1  12/2005  Extrand
2009/0032353 A1*  2/2009  Golden ............... F16D 37/008
                                                    192/21.5

FOREIGN PATENT DOCUMENTS

CN          105552089 A      5/2016
CN          105679806 A      6/2016
(Continued)

OTHER PUBLICATIONS

Machine Translation of KR 10-2018-0073298. (Year: 2018).*
First Office Action for CN Patent Application No. 201910125372.X dated Sep. 30, 2020.

*Primary Examiner* — Brian Handville
(74) *Attorney, Agent, or Firm* — Thomas | Horstemeyer, LLP (57) ABSTRACT

The present disclosure relates to the field of display technology and, more particularly, to a carrier substrate and its fabricating method, a flexible substrate and its fabricating method, and a display device. The carrier substrate includes a base including a first face and a second face opposite to the first face; a bonding portion disposed on the second face and including a magnetic particle, the magnetic particle being capable of rotating under the action of an external magnetic field, wherein the magnetic particle includes a first portion and a second portion, when the first portion faces a side away from the first face, a binding force between the bonding portion and a flexible base can be weakened; when the second portion faces the side away from the first face, a binding force between the bonding portion and the flexible base can be enhanced.

17 Claims, 2 Drawing Sheets

(51) Int. Cl.
    *G03F 7/09*      (2006.01)
    *H01L 51/56*     (2006.01)
    *G02F 1/1333*    (2006.01)

(52) U.S. Cl.
    CPC .......... *H01L 51/0097* (2013.01); *H01L 51/56* (2013.01); *G02F 1/133305* (2013.01); *H01L 2227/326* (2013.01); *H01L 2251/5338* (2013.01)

(58) Field of Classification Search
    CPC ......... H01L 2251/5338; H01L 2924/00; G03F 7/09; G02F 1/133305; G02F 1/1303
    See application file for complete search history.

(56) References Cited

FOREIGN PATENT DOCUMENTS

| | | |
|---|---|---|
| CN | 109360839 A | 2/2019 |
| JP | 2003173872 A | 6/2003 |
| KR | 20130082234 A | 7/2013 |
| KR | 20180073298 A | 7/2018 |

\* cited by examiner

CARRIER SUBSTRATE AND FABRICATING METHOD THEREOF, FLEXIBLE SUBSTRATE AND FABRICATING METHOD THEREOF, AND DISPLAY DEVICE

CROSS-REFERENCE TO RELATED APPLICATIONS

This disclosure is based upon, and claims the benefit and priority to, Chinese Patent Application No. 201910125372.X, filed on Feb. 20, 2019, the contents thereof being incorporated by reference in their entirety herein.

TECHNICAL FIELD

The present disclosure relates to the field of display technology and, in particular, to a carrier substrate and a fabricating method thereof, a flexible substrate and a fabricating method thereof, and a display device.

BACKGROUND

With the development of display technology, display products are increasingly diversified and humanized. Among them, the flexible display is an important developmental direction.

Presently, the fabricating method of the flexible substrate generally includes temporarily forming a flexible base on the carrier substrate with a rigid carrier substrate as a support, then, forming a functional layer on the flexible base to obtain a flexible substrate, and finally, peeling off the carrier substrate from the flexible base.

It should be noted that the information disclosed in the Background section above is only for enhancement of understanding of the background of the present disclosure, and thus, may include information that does not constitute prior art known to those of ordinary skill in the art.

SUMMARY

A first aspect of the present disclosure provides a carrier substrate, including:

a base including a first face and a second face opposite to the first face;

a bonding portion disposed on the second face, the bonding portion including a magnetic particle, the magnetic particle being capable of rotating under the action of an external magnetic field, wherein the magnetic particle includes a first portion and a second portion, when the first portion faces a side away from the first face, a binding force between the bonding portion and a flexible base can be weakened; and when the second portion faces the side away from the first face, the binding force between the bonding portion and the flexible base can be enhanced.

In an exemplary embodiment of the present disclosure, the first portion is disposed opposite to the second portion, and the first portion or the second portion is magnetic.

In an exemplary embodiment of the present disclosure, the bonding portion further includes an adhesive bonded to the second face, and a magnetic particle is wrapped in the adhesive and is capable of rotating within the adhesive.

In an exemplary embodiment of the present disclosure, the first portion includes a lyophobic portion, and the second portion includes a lyophilic portion, the lyophobic portion or the lyophilic portion being provided with a magnetic coating.

In an exemplary embodiment of the present disclosure, the adhesive is wrapped with a plurality of the magnetic particles, the first portion of each of the magnetic particles having the same orientation, and the second portion of each of the magnetic particles having the same orientation.

In an exemplary embodiment of the present disclosure, a groove is formed on the second face and the bonding portion is provided in the groove, the bonding portion being flushed with or protruded from an edge of the groove.

In an exemplary embodiment of the present disclosure, the base includes a first layer and a second layer formed on the first layer, a face of the second layer away from the first layer is the second face, wherein a rigidity of the second layer is less than a rigidity of the first layer.

In an exemplary embodiment of the present disclosure, the second layer is photoresist.

A second aspect of the present disclosure provides a fabricating method of a carrier substrate, including:

forming a base including a first face and a second face opposite to the first face;

forming a bonding portion including a magnetic particle, the magnetic particle including a first portion and a second portion;

providing the bonding portion on the second face of the base;

wherein the magnetic particle is capable of rotating under the action of an external magnetic field, wherein the first portion is capable of weakening a binding force between the bonding portion and a flexible base when the first portion faces a side away from the first face;

wherein the second portion is capable of enhancing the binding force between the bonding portion and the flexible base when the second portion faces the side away from the first face.

In an exemplary embodiment of the present disclosure, before providing the bonding portion on the second face of the base, the fabricating method further includes:

forming a groove on the second face of the base;

wherein the bonding portion is disposed in the groove, and the bonding portion is flushed with or protruded from an edge of the groove.

In an exemplary embodiment of the present disclosure, forming the base includes:

providing a first layer;

forming a second layer on a side of the first layer, a face of the second layer away from the first layer being the second face, wherein a rigidity of the second layer is less than a rigidity of the first layer.

In an exemplary embodiment of the present disclosure, the second layer is photoresist;

wherein forming the groove on the second face of the base includes:

forming the groove on the second face by a photolithography process.

In an exemplary embodiment of the present disclosure, providing the bonding portion on the second face of the base includes:

filling the bonding portion in the groove by coating, the bonding portion being flushed with an edge of the groove.

A third aspect of the present disclosure provides a fabricating method of a flexible substrate, including:

providing a carrier substrate, which is the carrier substrate according to any one of the above aspects;

applying a first external magnetic field to the carrier substrate to induce rotation of the magnetic particle, such that the second portion faces a side away from the first face;

combining the flexible base to the second face of the base through the bonding portion;

forming a functional layer on the flexible base to obtain a flexible substrate;

applying a second external magnetic field to the carrier substrate to induce rotation of the magnetic particle such that the first portion faces a side away from the first face; and separating the flexible substrate from the carrier substrate.

A fourth aspect of the present disclosure provides a flexible substrate, wherein the flexible substrate is fabricated by the fabricating method of the flexible substrate according to the above aspects.

A fifth aspect of the present disclosure provides a display device including the flexible substrate in the above aspects.

It should be understood that both the foregoing general description and the details described hereinafter are merely exemplary and explanatory and are not intended to limit the present disclosure.

BRIEF DESCRIPTION OF THE DRAWINGS

The figures herein that are incorporated in and constitute a part of this description, illustrate the principles of the embodiment consistent with the present disclosure and, together with the description, serve to explain the present disclosure. It is apparent that the drawings in the following description are only some of the embodiments of the present disclosure, and for those skilled in the art, other drawings may be obtained from these figures without additional creative work.

DETAILED DESCRIPTION

In the related art, a laser is generally used to peel off the flexible substrate from the carrier substrate, but the operation is complicated, the cost is high, and the flexible base is easily damaged, thereby reducing the fabrication yield of the flexible substrate. Alternatively, when the flexible base is formed on the carrier substrate, the adhesion between the carrier substrate and the flexible base is reduced to peel off the flexible substrate from the carrier substrate with a mechanical force afterwards. However, since the adhesion between the flexible base and the carrier substrate is reduced, in the fabricating process of the flexible substrate, the flexible base is easily moved on the carrier substrate, thereby easily affecting the fabricating quality of the flexible substrate and reducing the fabrication yield of the flexible substrate.

Example embodiments will now be described more fully with reference to the accompanying drawings. However, exemplary embodiments can be implemented in various forms and should not be construed as limited to the embodiments set forth herein; rather, these embodiments are provided so that this disclosure will be thorough and complete, and the concept of example embodiments will fully convey to those skilled in the art. The same reference numerals in the drawings denote the same or similar structures, and thus their detailed description will be omitted.

Although the relative terms such as "upper" and "lower" are used in the description to describe the relative relationship of one component illustrated in figures to another component, these terms are used in this description for convenience only. For example, according to the direction of the example described in the accompanying drawings, it will be understood that if the device illustrated in the figures is flipped upside down, the "upper" component will become the "lower" component. When a structure is "on" another structure, it may mean that a structure is integrally formed on another structure, that a structure is "directly" disposed on another structure, or that a structure is "indirectly" disposed through another structure on other structures.

The terms "a", "an", "the", "the", and "at least one" are used to indicate the presence of one or more elements, parts, etc. The terms "including" and "having" are used to mean open inclusive means, and there may be additional elements, components, etc., in addition to the listed elements, components, etc. The terms "first" and "second" are used only as marks without limiting the number of objects.

In the related art, in order to achieve the peeling between the flexible base and the carrier substrate, the following methods are generally used:

First, when the flexible base is directly formed on the carrier substrate, the interface between the flexible base and the carrier substrate may be processed using a laser (e.g., excimer laser) device to peel the flexible base from the carrier substrate, but this easily leads to the damage of the flexible base, thereby reducing the fabricating yield of the flexible substrate. In addition, laser equipment has a high cost, and is complicated to operate.

Second, when the flexible base is formed on the carrier substrate by a sacrificial layer, the sacrificial layer may be processed by a laser, so that the flexible substrate is peeled from the carrier substrate, but one sacrificial layer will be given away for producing one flexible substrate layer, that is, the sacrificial layer is not reusable, and therefore, the fabricating cost of the flexible substrate is greatly increased, and in addition, the laser device is expensive and complicated in operation.

Third, when the flexible base is formed on the carrier substrate, reducing the adhesion between the carrier substrate and the flexible base is beneficial to peel off the flexible substrate from the carrier substrate with a mechanical force afterwards. However, since the adhesion between the flexible base and the carrier substrate is reduced, in the fabricating process of the flexible substrate, the flexible base is easily moved on the carrier substrate, thereby easily affecting the fabricating quality of the flexible substrate and reducing the fabrication yield of the flexible substrate.

Figure 1:
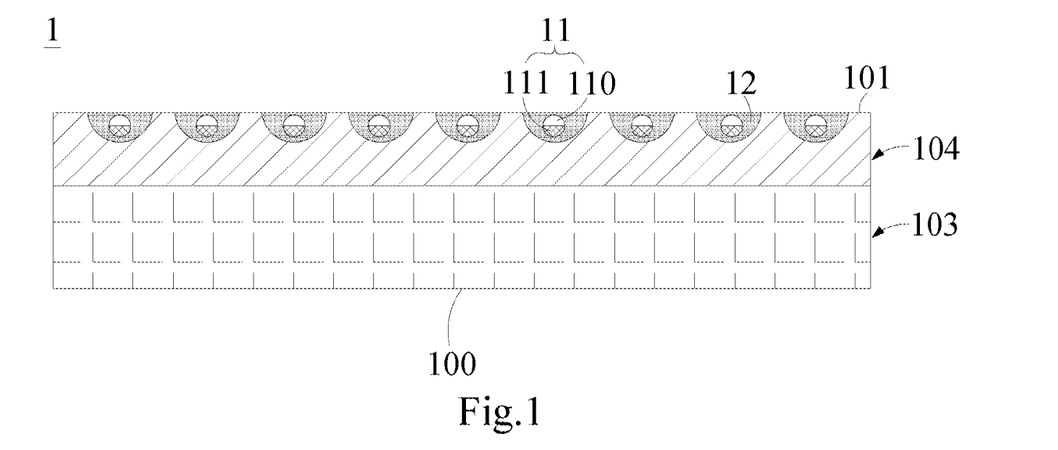
FIG. 1 is a structural schematic view of magnetic particles in a state in the carrier substrate according to an embodiment of the present disclosure.
Figure 2:
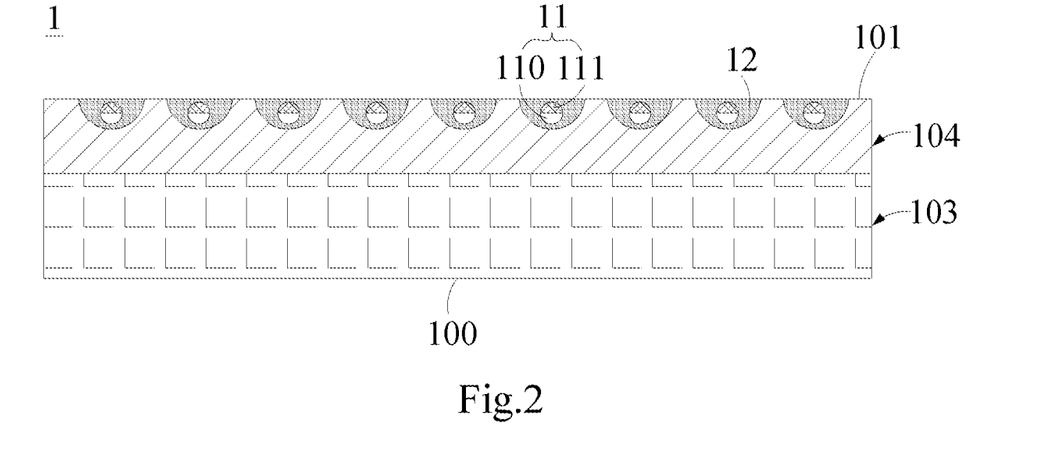
FIG. 2 is a structural schematic view of the magnetic particles in another state in the carrier substrate according to an embodiment of the present disclosure.
Figure 3:
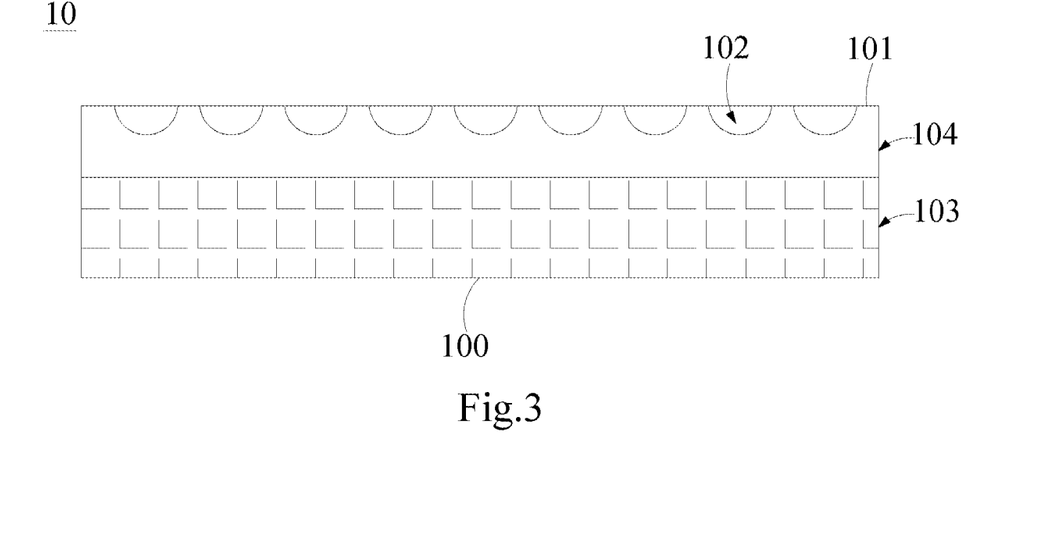
FIG. 3 is a structural schematic view of a base in the carrier substrate according to an embodiment of the present disclosure.

The embodiment of the present disclosure provides a carrier substrate 1 that can be applied in a fabricating process of a flexible substrate. As shown in FIG. 1 to FIG. 3, the carrier substrate 1 may include a base 10 and a bonding portion, wherein:

The base 10 includes a first face 100 and a second face 101 opposite to the first face 100, wherein, in the fabricating process of the flexible substrate, the first face 100 of the base 10 is a face of the base 10 away from the flexible substrate, and the second face 101 of the base 10 is a face of the base 10 towards the flexible substrate. In other words, the second face 101 of the base 10 may be used to dispose a flexible base, which is necessary for forming the flexible substrate.

A bonding portion may be provided on the second face 101 of the base 10, and can be combined with the flexible base. The bonding portion may include a magnetic particle 11, and the magnetic particle 11 is a particle having a certain magnetism, and can be rotated under the action of an external magnetic field.

The magnetic particle 11 may include a first portion 110 and a second portion 111, wherein the first portion 110 and the second portion 111 have different characteristics. In particular, when the first portion 110 faces a side away from the first face 100, the side away from the first face 100 is the side where the flexible base is located, that is, when the first portion 110 faces the flexible base, the binding force between the bonding portion and the flexible base can be weakened. Also, when the second portion 111 faces the side away from the first face 100, that is, when the second portion 111 faces the flexible base, the binding force between the bonding portion and the flexible base can be enhanced.

Based on the foregoing, the magnetic particle 11 in the bonding portion includes the first portion 110 and the second portion 111 having different characteristics, the magnetic particle 11 can be rotated under the action of an external magnetic field, and, in the fabricating process of the flexible substrate, the orientations of the first portion 110 and the second portion 111 can be adjusted by adjusting the external magnetic field, thereby changing the binding force between the bonding portion and the flexible base, that is, changing the binding force between the carrier substrate 1 and the flexible base, which achieves stable bonding and convenient separation between the carrier substrate 1 and the flexible substrate.

In particular, in the process of fabricating the flexible substrate, an external magnetic field may be applied to the carrier substrate so that the second portion 111 in the magnetic particle 11 is turned to the flexible base, as shown in FIG. 2, thereby increasing the binding force between the bonding portion and the flexible base to ensure the binding stability between the flexible base and the carrier substrate 1, thereby avoiding the occurrence of tilting, moving, and falling off of the flexible base on the carrier substrate 1 in the fabricating process, and thereby improving the fabricating quality of the flexible substrate and the production yield of the flexible substrate.

After finishing fabrication of the flexible substrate, when the flexible substrate and the carrier substrate 1 is required to be separated from each other, another external magnetic field can be applied to the carrier substrate 1, such that the first portion 110 in the magnetic particle 11 is turned to the flexible base, as shown in FIG. 1, such that the binding force between the bonding portion and the flexible base can be weakened so that the fabricated flexible substrate can be peeled off from the carrier substrate 1 by using only mechanical force. That is, in this embodiment, the peeling of the flexible substrate and the carrier substrate 1 can be achieved without using the laser, which can reduce the peeling difficulty and the peeling cost between the flexible substrate and the carrier substrate 1, and can also alleviate the damage of the flexible substrate during the peeling process and improve the production yield of the flexible substrate. In addition, the peeled carrier substrate 1 can be reused, reducing the production cost of the flexible substrate.

The carrier substrate 1 mentioned in this embodiment will be specifically described below with reference to the accompanying drawings.

In one embodiment, as shown in FIG. 3, grooves 102 may be formed in the second face 101 of the base 10, and the grooves 102 may be made by etching, embossing, and the like processing technology. The bonding portion may be provided in the grooves 102 so that the design can reduce positioning difficulty of the bonding portion and the base 10, and further, may also ensure the assembly stability of the bonding portion and the base 10.

The bonding portion may be flushed with or protruded from an edge of the groove 102, i.e., a side of the bonding portion facing away from the first face 100 may be flushed with or protruded from the second face 101 to ensure that the bonding portion can be in contact with the flexible base. Preferably, the bonding portion is flushed with the edge of the groove 102, which can increase the contact area of the flexible base and the carrier substrate 1, so that the flexible base can be stably supported on the second face 101 of a carrier substrate 1.

In detail, the base 10 may be a multilayer structure, which may include a first layer 103 and a second layer 104, wherein the second layer 104 is formed on the first layer 103. It should be noted that a face of the second layer 104 facing away from the first layer 103 is the second face 101. Since the second face 101 of the second layer 104 needs to be processed to form the grooves 102, the second layer 104 can be made of a less rigid material in order to reduce the processing difficulty of the grooves 102, However, since the base 10 is also required to support the flexible base, and therefore, in order to ensure the base 10 to stably support the flexible base, the first layer 103 can be made by a relatively rigid material. In summary, the second layer 104 in the base 10 is less rigid than the first layer 103.

For example, the first layer 103 may include a structure having a certain rigidity, such as glass, quartz, silicon wafer, or metal, but is not limited thereto.

The second layer 104 can be a photoresist, but is not limited thereto. It should be noted that, in the case that the second layer 104 is a photoresist, the grooves 102 can be made by a photolithography process, in order to reduce the processing difficulty of the grooves 102. In addition, the photoresist also has a certain buffer capability, thus, has protective effects on subsequent production of the flexible substrate, thereby ensuring the production yield of the flexible substrate.

It should be noted that the base 10 may be not only the above-mentioned multilayer structure but also a single layer structure, which can be determined based on the specific circumstance.

In one embodiment, as illustrated in FIGS. 1 and 2, the bonding portion includes not only the magnetic particles 2 mentioned above, but may also include an adhesive 12, where the magnetic particles 11 are wrapped in the adhesive 12. The magnetic particles 11 can rotate within the adhesive 12, and the adhesive 12 is bonded to the second face 101 of the base 10, so that the bonding portion is bonded to the base 10. Further, in the process of fabricating the flexible base, the adhesive 12 may be bonded to the flexible base to bond the flexible base to the second face 101 of the base 10, that is, the binding force between the bonding portion and the flexible base can be an adhesive force.

Since the bonding portion is bonded with the flexible base by the adhesive 12, the adhesive force between the adhesive 12 and the flexible base can be adjusted by adjusting the affinity between the adhesive 12 and the flexible base. In detail, the first portion 110 of each of the magnetic particles 11 may include a lyophobic portion i.e., the first portion 110 has a lyophobic property. Therefore, when the first portion 110 faces toward the flexible base, the affinity between the adhesive 12 and the flexible base is reduced so that the adhesive force between the adhesive 12 and the flexible base is weakened, resulting in easy separation of the flexible base from the carrier substrate 1. The second portion 111 may include a lyophilic portion, i.e., the second portion 111 has a lyophilic property. Therefore, when the second portion 111 faces toward the flexible base, the affinity between the adhesive 12 and the flexible base is enhanced so that the adhesive force between the adhesive 12 and the flexible base is enhanced, which in turn ensures combination stability of the flexible base and the carrier substrate 1.

For example, the adhesive 12 can be filled in the aforementioned grooves 102. The adhesive 12 may be in the form of gel to facilitate the rotation of the magnetic particles 11 within the adhesive 12. Preferably, the adhesive 12 may be a particle liquid gel which is in a liquid state and has various characteristics, such as high chemical stability and temperature stability to withstand a variety of baking temperatures in the process of fabricating the flexible base.

A plurality of magnetic particles 11 may be wrapped in the adhesive 12. When the adhesive 12 wraps a plurality of magnetic particles 11, the first portion 110 of each of the magnetic particles 11 is directed in the same orientation, and the second portion 111 of each of the magnetic particles 11 is directed in the same orientation, so as to uniformly adjust the orientations of the first portions 110 and the second portions 111 in the magnetic particles 11, reducing the difficulty for adjusting the external magnetic field.

For example, the magnetic particles 11 may include silica nanospheres, gold nanospheres, and the like, which may be sized between 10 nm-100 nm, for example, 10 nm, 40 nm, 70 nm, 100 nm, etc. The bonding portion may be sized between 100 nm-600 nm, for example, 100 nm, 200 nm, 300 nm, 400 nm, 500 nm, 600 nm and the like.

In an embodiment, as shown in FIG. 1 and FIG. 2, the first portions 110 and the second portions 111 of the magnetic particles 11 may be oppositely disposed, that is, the first portions 110 and the second portions 111 are opposite in orientation, i.e., when the first portions 110 face towards the flexible base, the second portions 111 face away from the flexible base. When the first portions 110 face away from the flexible base, the second portions 111 face towards the flexible base.

In this embodiment, the first portions 110 and second portions 111 are disposed oppositely, on one hand, to prevent the first portions 110 and second portions 111 interacting in the fabricating process of the flexible substrate, such that the binding force between the flexible substrate and the carrier substrate 1 cannot meet fabricating requirements. On the other hand, to reduce the difficulty for adjusting the external magnetic field, the only need is to change the direction of the external magnetic field when turning the orientations of the first portions 110 and second portions 111, which has a simple operation.

It should be noted that since the first portion 110 and second portion 111 are parts of the magnetic particle 11. Thus, when the magnetic particle 11 is rotated by applying an external magnetic field to adjust the orientation of one of the first portion 110 and second portion 111, the orientation of the other of the first portion 110 and second portion 111 is adjusted at the same time. Therefore, the only need in the design of the magnetic particle 11 is that one of the first portion 110 and second portion 111 is magnetic, such that the orientation of one (the first portion 110 or second portion 111) of magnetic particle 11 may be adjusted by the external magnetic field, reducing the difficulty for adjusting the external magnetic field.

For example, when the first portion 110 is magnetic, the first portion 110 may include a magnetic coating in addition to the lyophobic portion mentioned above. The magnetic coating may be disposed on the Lyophobic portion and, when the second portion 111 is magnetic, the second portion 111 may include a magnetic coating in addition to the lyophilic portion. Further, the magnetic coating may be disposed on the lyophilic portion. It should be noted that the magnetic coating may be a superparamagnetic polymer coating containing iron, cobalt, nickel, gadolinium, terbium, or the like, such as that formed of a magnetic ionic liquid polymer, but is not limited thereto.

Furthermore, the present disclosure further provides a fabricating method of a carrier substrate 1 to fabricate the carrier substrate 1 described in any of the preceding embodiments.

Figure 4:
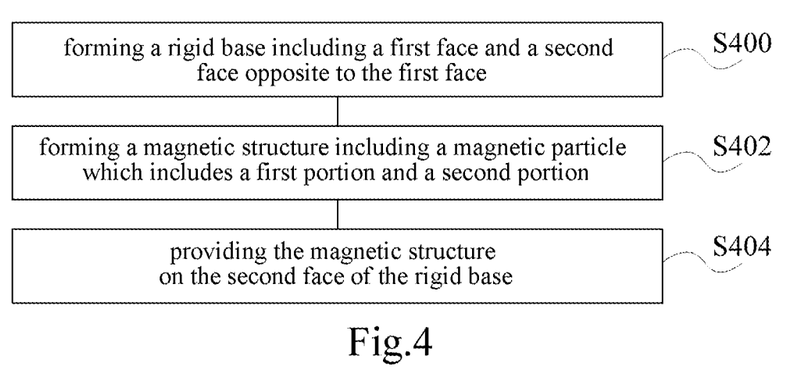
FIG. 4 is a flowchart of a fabricating method for the carrier substrate according to an embodiment of the present disclosure.

Specifically, as shown in FIG. 4, the fabricating method of the carrier substrate 1 may include:

step S400, forming a base 10 including a first face 100 and a second face 101 opposite to the first face 100;

step S402, forming a bonding portion including a magnetic particle 11, the magnetic particle 11 including a first portion 110 and a second portion 111;

step S404, providing the bonding portion on the second face 101 of the base 10;

wherein the magnetic particle 11 is capable of rotating under the action of an external magnetic field;

wherein the first portion 110 is capable of weakening a binding force between the bonding portion and a flexible base when the first portion 110 faces a side away from the first face 100; and wherein the second portion III is capable of enhancing the binding force between the bonding portion and the flexible base when the second portion 111 faces the side away from the first face 100.

The fabricating method of the carrier substrate 1 mentioned in this embodiment will be specifically described below with reference to the accompanying drawings.

In step S400, the base 10 is formed. As shown in FIGS. 1 to 3, the base 10 includes a first face 100 and a second face 101 opposite to the first face 100, In detail, this step S400 may include step S4001 and step S4002, wherein, In step S4001, a first layer 103 is provided. For example, the first layer 103 may include a structure having a certain rigidity such as glass, quartz, silicon wafer, or metal, but is not limited thereto.

In step S4002, a second layer 104 is formed at a side of the first layer 103. A face of the second layer 104 facing away from the first layer 103 is the second face 101, and a rigidity of the second layer 104 is less than that of the first layer 103.

For example, the second layer 104 may be a photoresist. The photoresist may be formed on the first layer 103 by a spin coating process, but is not limited thereto.

In step S402, the bonding portion is formed. As shown in FIG. 1 and FIG. 2, the bonding portion may include a magnetic particle 11, where the magnetic particle 11 may include a first portion 110 and a second portion 111.

It should be noted that the aforementioned bonding portion may include not only the magnetic particle 11, but also an adhesive 12 encapsulating the magnetic particle 11. The first portion 110 may include a lyophobic portion, the second portion 111 may include a lyophilic portion, and the lyophobic portion or the lyophilic portion may be provided with a magnetic coating.

For example, a method of forming the bonding portion may include:

In the first step, a magnetic particle 11 is provided. In detail, first, microemulsion of nanoparticles is uniformly coated on a clean flat glass substrate, and the microemulsion is slowly removed through slow volatilization. Due to the self-gravitation of surface tension, a regular nanoparticle array is formed, and the nanoparticles are lyophilic; then a small amount of magnetic ionic liquid is added to the nanoparticle array to control its volume, so that the upper limit of the liquid surface of the ionic liquid can only reach the radius height of the nanoparticles. It should be noted that, since the liquid volume of the magnetic particles 11 is less, based on the action of capillary force and surface tension most parts of the magnetic particle 11 liquid will be automatically adsorbed on the surface of the nanoparticles. Then, the photopolymerization technology is used to make the magnetic particle 11 liquid form a coating on the surface of the nanoparticles, e.g., making half of the nanoparticles form the magnetic coating. Then, the other half of the nanoparticles (magnetic coating portion is not formed) is formed to have lyophobic characteristic by self-assembly, thereby completing the preparation of the magnetic particle 11 which is two-sided, a portion of which is the lyophilic part and the other portion of which is the lyophobic portion, and the lyophilic part may be provided with a magnetic coating.

It should be noted that the magnetic ionic liquid may be 1-ethyl-three-methylimidazolium (trifluoromethanesulfonyl)-two-imide that is a cation, an anion of which is tetrachloro compound of iron, cobalt, nickel, gadolinium, terbium, such as: FeCl4 (four ferric chloride), CoCl4 (four cobalt chloride), NiCl4 (four nickel chloride), GdCl4 (four gadolinium chloride), and the like.

In the second step, the magnetic particles 11 provided above are separated from the glass substrate by ultrasonic waves, and are sufficiently dispersed and dispersed in the adhesive 12 in a certain ratio to form a bonding portion. The mass ratio of the magnetic particles 11 in the bonding portion is controlled to be between 1% and 50%.

In step S404, the bonding portion is provided on the second face 101 of the base TO, as shown in FIGS. 1 and 2.

For example, the bonding portion may be provided on the second face 101 of the base 10 by bonding.

Before providing the bonding portion on the second face 101 of the base 10, the method may further include: at step S403, forming a groove 102 on the second face 101 of the base 10, as shown in FIG. 3. The bonding portion is disposed in the groove 102, and the bonding portion is flushed with or protruded from an edge of the groove.

It should be noted that the aforementioned second layer 104 may be a photoresist. If the second layer 104 is a photoresist, the photolithography process may be used to form a groove 102 formed on the second face 101.

Further, when the groove 102 is formed on the second face 101 of the base 10, the bonding portion may be filled to the groove 102 through coating, and the bonding portion may be flushed with the edge of the groove 102.

Further, the embodiment also provides a fabricating method of a flexible substrate, the flexible substrate being fabricated based on the carrier substrate 1 described in any of the above embodiments.

Figure 5:
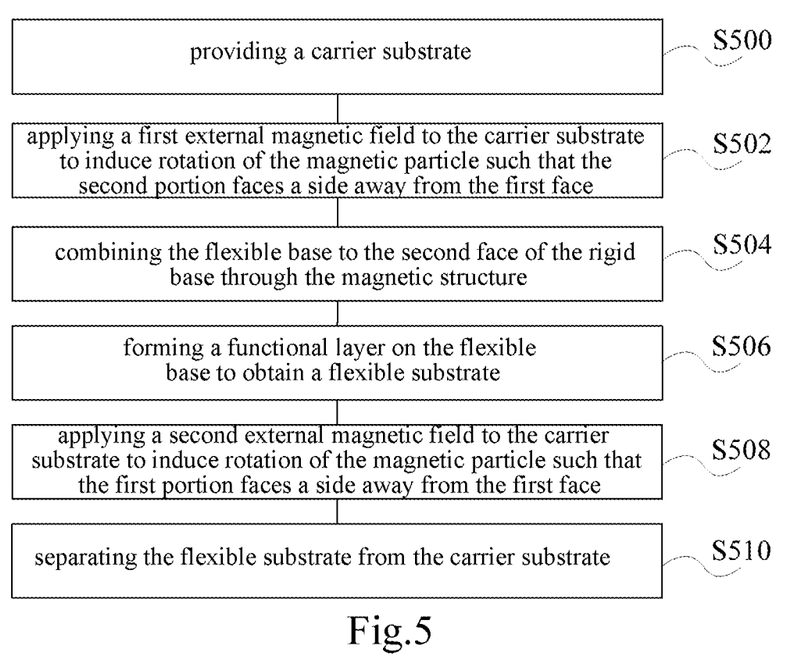
FIG. 5 is a flowchart of a fabricating method for a flexible substrate according to an embodiment of the present disclosure.

Specifically, as shown in FIG. 5, the fabricating method of the flexible substrate may include step S500, step S502, step S504, step S506, step S508 and step S510 wherein:

In step S500, a carrier substrate 1 is provided, the carrier substrate 1 is a carrier substrate 1 according to any of the above embodiments, which is not detailed herein.

In step S502, a first external magnetic field is applied to the carrier substrate 1 to induce rotation of the magnetic particle 11, such that the second portion 111 faces a side away from the first face 100, i.e., the second portion 111 faces a side where the flexible base is located, as shown in FIG. 2.

In step S504, the flexible base is combined to the second face 101 of the base 10 through the bonding portion, since the second portion 111 faces a side where the flexible base is located. At this moment, the binding force between the flexible base and the carrier substrate 1 is strong, avoiding the situation that the flexible base is lifted, moved, or dropped on the carrier substrate 1 during the fabricating process, thereby improving the fabricating quality of the flexible substrate and improving the production yield of the flexible substrate.

In step S506, a functional layer is formed on the flexible base to obtain a flexible substrate. It should be noted that the functional layer in this embodiment refers to a structural layer capable of realizing display function, touch function, and the like on the flexible substrate, such as a thin film transistor, a pixel circuit layer, a touch electrode layer, a color filter layer, and the like. The flexible base mentioned in this embodiment may be a pure flexible material layer, and then, the functional layer is further fabricated on the flexible material layer to obtain a flexible base having practical functions; or the flexible base includes a flexible material layer and a functional stock layer provided on the flexible material layer. For example, a layer of electrode material has been provided, and only a patterning process is required to obtain a flexible substrate having a corresponding function.

In step S508, a second external magnetic field is applied to the carrier substrate 1 to induce rotation of the magnetic particle 11, such that the first portion 110 faces a side away from the first face 100, i.e., the first portion 110 faces a side where the flexible base is located, as shown in FIG. 1, to reduce the binding force between the flexible base and the carrier substrate 1. It should be noted that when the orientations of the first portion 110 and the second portion 111 are opposite, the difference between the second external magnetic field and the first external magnetic field is that they have different directions.

In step S510, the flexible substrate is separated from the carrier substrate. Since the binding force between the flexible base and the carrier substrate 1 is reduced, the fabricated flexible substrate can be peeled from the carrier substrate 1 by only using the mechanical force.

Further, the embodiment of the present disclosure further provides a flexible substrate, which is fabricated by the fabricating method of the flexible substrate mentioned above. The flexible substrate may be OLED (Organic Light-EmittingDiode), or may also be a liquid crystal display panel.

Further, the embodiment of the present disclosure further provides a display device including the above flexible substrate. The display device can be a mobile phone, a tablet computer, a smart wearable device, an electronic newspaper, a smart ID card, and the like.

The technical solution provided by the present disclosure can achieve the following beneficial effects:

In the carrier substrate and its fabricating method, the flexible substrate and its fabricating method, and the display device according to the present disclosure, since the magnetic particle in the bonding portion includes the first portion and the second portion having different characteristics, and the magnetic particle is capable of rotating under the effect of an external magnetic field, in the fabricating process of the flexible substrate, the orientations of the first portion and the second portion can be adjusted by adjusting the external magnetic field to alter the binding force between the bonding portion and the flexible base, that is, alter the binding force between the carrier substrate and the flexible base to achieve stable combination and convenient separation between the carrier substrate and the flexible substrate. That is to say, in the embodiment, the binding force between the flexible base and the carrier substrate can be adjusted by using an external magnetic field, so that the fabricating quality of the flexible substrate can be improved, while peeling difficulty and peeling cost of a flexible base and the carrier substrate are reduced.

Other embodiments of the present disclosure will be apparent to those skilled in the art after considering the description and the practice of the present disclosure disclosed herein. The present application is intended to cover any variations, uses, or adaptations of the present disclosure, which are in accordance with the general principles of the disclosure and include common general knowledge or common technical means in the art that are not disclosed in the present disclosure. The description and examples be considered as exemplary only; the true scope and spirit of the present disclosure are pointed by the appended claims.

What is claimed is:

1. A carrier substrate, comprising:
   a base comprising a first face and a second face opposite to the first face;
   a bonding portion disposed on the second face, the bonding portion comprising a magnetic particle, the magnetic particle being capable of rotating under an action of an external magnetic field, wherein the magnetic particle comprises a first portion and a second portion such that:
   when the first portion faces a side away from the first face, a binding force between the bonding portion and a flexible base can be weakened; and
   when the second portion faces the side away from the first face, the binding force between the bonding portion and the flexible base can be enhanced;
   wherein the bonding portion further comprises an adhesive bonded to the second face, and the magnetic particle is wrapped in the adhesive and is capable of rotating within the adhesive; and
   wherein the first portion comprises a lyophobic portion, the second portion comprises a lyophilic portion, and the lyophobic portion or the lyophilic portion is provided with a magnetic coating.

2. The carrier substrate according to claim 1, wherein the first portion is disposed opposite to the second portion, and the first portion or the second portion is magnetic.

3. The carrier substrate according to claim 1, wherein:
   the magnetic particle is one of a plurality of magnetic particles; and
   the adhesive is wrapped with the magnetic particles, the first portion of each of the magnetic particles having a same orientation, and the second portion of each of the magnetic particles having a same orientation.

4. The carrier substrate according to claim 1, wherein a groove is formed on the second face, the bonding portion is provided in the groove, and the bonding portion is flushed with or protruded from an edge of the groove.

5. The carrier substrate according to claim 4, wherein the base comprises a first layer and a second layer formed on the first layer, a face of the second layer away from the first layer is the second face, wherein a rigidity of the second layer is less than a rigidity of the first layer.

6. The carrier substrate according to claim 5, wherein the second layer is a photoresist.

7. A fabricating method of a carrier substrate, comprising:
   forming a base comprising a first face and a second face opposite to the first face;
   forming a bonding portion comprising a magnetic particle, the magnetic particle comprising a first portion and a second portion; and
   providing the bonding portion on the second face of the base, wherein:
   the magnetic particle is capable of rotating under an action of an external magnetic field;
   the first portion is capable of weakening a binding force between the bonding portion and a flexible base when the first portion faces a side away from the first face;
   the second portion is capable of enhancing the binding force between the bonding portion and the flexible base when the second portion faces the side away from the first face;
   the bonding portion further comprises an adhesive bonded to the second face, and the magnetic particle is wrapped in the adhesive and is capable of rotating within the adhesive; and
   the first portion comprises a lyophobic portion, the second portion comprises a lyophilic portion, and the lyophobic portion or the lyophilic portion is provided with a magnetic coating.

8. The fabricating method of the carrier substrate according to claim 7, wherein before providing the bonding portion on the second face of the base, the fabricating method further comprises forming a groove on the second face of the base, wherein the bonding portion is disposed in the groove and the bonding portion is flushed with or protruded from an edge of the groove.

9. The fabricating method of the carrier substrate according to claim 8, wherein forming the base comprises:
   providing a first layer; and
   forming a second layer on a side of the first layer, a face of the second layer away from the first layer being the second face, wherein a rigidity of the second layer is less than a rigidity of the first layer.

10. The fabricating method of the carrier substrate according to claim 9, wherein the second layer is a photoresist; and
    wherein forming the groove on the second face of the base comprises forming the groove on the second face by a photolithography process.

11. The fabricating method of the carrier substrate according to claim 8, wherein providing the bonding portion on the second face of the base comprises filling the bonding portion in the groove by coating, the bonding portion being flushed with an edge of the groove.

12. A method, comprising:
    providing a carrier substrate, the carrier substrate comprising:
    a base comprising a first face and a second face opposite to the first face;
    a bonding portion disposed on the second face, the bonding portion comprising a magnetic particle, the magnetic particle being capable of rotating under an action of an external magnetic field, wherein the magnetic particle comprises a first portion and a second portion such that:
when the first portion faces a side away from the first face, a binding force between the bonding portion and a flexible base can be weakened; and
when the second portion faces the side away from the first face, the binding force between the bonding portion and the flexible base can be enhanced;
wherein the bonding portion further comprises an adhesive bonded to the second face, and the magnetic particle is wrapped in the adhesive and is capable of rotating within the adhesive; and
wherein the first portion comprises a lyophobic portion, the second portion comprises a lyophilic portion, and the lyophobic portion or the lyophilic portion is provided with a magnetic coating.

13. The method according to claim 12, wherein the first portion is disposed opposite to the second portion, and the first portion or the second portion is magnetic.

14. The method according to claim 12, wherein:
the magnetic particle is one of a plurality of magnetic particles; and
the adhesive is wrapped with the magnetic particles, the first portion of each of the magnetic particles having a same orientation, and the second portion of each of the magnetic particles having a same orientation.

15. The method according to claim 12, wherein a groove is formed on the second face, the bonding portion is provided in the groove, and the bonding portion is flushed with or protruded from an edge of the groove.

16. The method according to claim 15, wherein the base comprises a first layer and a second layer formed on the first layer, a face of the second layer away from the first layer is the second face, wherein a rigidity of the second layer is less than a rigidity of the first layer.

17. The method according to claim 16, wherein the second layer is a photoresist.

* * * * *